(12) United States Patent
Chung et al.

(10) Patent No.: US 9,583,738 B2
(45) Date of Patent: Feb. 28, 2017

(54) DISPLAY DEVICE INCLUDING REFLECTING LAYER

(71) Applicant: SAMSUNG DISPLAY CO., LTD., Yongin-si, Gyeonggi-do (KR)

(72) Inventors: Yun-Mo Chung, Yongin-si (KR); Byoung Ki Kim, Seoul (KR); Ho Jin Yoon, Hwaseong-si (KR); Dae Woo Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/985,349

(22) Filed: Dec. 30, 2015

(65) Prior Publication Data

US 2016/0285048 A1 Sep. 29, 2016

(30) Foreign Application Priority Data

Mar. 26, 2015 (KR) .................. 10-2015-0042608

(51) Int. Cl.
| | |
|---|---|
| *H01L 51/52* | (2006.01) |
| *H01L 27/32* | (2006.01) |
| *G02F 1/13* | (2006.01) |
| *G02F 1/1368* | (2006.01) |
| *G02F 1/1335* | (2006.01) |
| *G02F 1/1339* | (2006.01) |

(52) U.S. Cl.
CPC ........ *H01L 51/5271* (2013.01); *G02F 1/1339* (2013.01); *G02F 1/1368* (2013.01); *G02F 1/133553* (2013.01); *H01L 27/3244* (2013.01); *H01L 51/5259* (2013.01)

(58) Field of Classification Search
CPC ............ H01L 51/5271; H01L 51/5259; H01L 27/3244; G02F 1/133553; G02F 1/1339; G02F 1/1368
See application file for complete search history.

(56) References Cited

U.S. PATENT DOCUMENTS

| | | | |
|---|---|---|---|
| 7,728,494 B2 * | 6/2010 | Park ................... | H01J 29/96 313/310 |
| 2009/0026383 A1 * | 1/2009 | Kim .................. | H01L 27/14683 250/370.11 |

FOREIGN PATENT DOCUMENTS

| | | | |
|---|---|---|---|
| JP | 2014126730 A | * | 7/2014 |
| KR | 10-2002-0037758 A | | 5/2002 |
| KR | 10-2004-0025448 A | | 3/2004 |
| KR | 10-0700006 B1 | | 3/2007 |
| KR | 10-0897157 B1 | | 5/2009 |
| KR | 10-2014-0003097 A | | 1/2014 |

* cited by examiner

*Primary Examiner* — Ida M Soward
(74) *Attorney, Agent, or Firm* — Lewis Roca Rothgerber Christie LLP

(57) ABSTRACT

A display device includes a reflecting layer. A display device according to an exemplary embodiment of the present invention includes: a lower substrate; an upper substrate facing the lower substrate; a thin film transistor on the lower substrate; and a first reflecting layer on a first surface of the upper substrate, the first surface facing the lower substrate, in which the lower substrate and the upper substrate include a display area for displaying an image, and a peripheral area outside the display area, and wherein the first reflecting layer is at the peripheral area, at display area, and at an area adjacent an edge of the upper substrate.

20 Claims, 15 Drawing Sheets

DISPLAY DEVICE INCLUDING REFLECTING LAYER

CROSS-REFERENCE TO RELATED APPLICATION

This application claims priority to and the benefit of Korean Patent Application No. 10-2015-0042608 filed in the Korean Intellectual Property Office on Mar. 26, 2015, the entire content of which is incorporated herein by reference.

BACKGROUND

1. Field

Aspects of the present invention relate to a display device including a reflecting layer.

2. Description of the Related Art

Display devices, such as liquid crystal displays (LCD), organic light emitting diode displays (OLED display), and electrophoretic displays, include field generating electrodes and an electro-optical active layer. For example, an OLED display includes an organic light emitting layer as the electro-optical active layer, and an LCD includes a liquid crystal layer as the electro-optical active layer. Field generating electrodes may be connected to a switching element, such as a thin film transistor, to receive a data signal, and the electro-optical active layer may display an image by converting the data signal into an optical signal.

When impurities, such as moisture or oxygen, flow into the display device from a surrounding environment, oxidation of or peeling of an element of the display device, such as an electrode and the like, may result, so that the lifespan of the element may be decreased, or so that efficiency of the element may deteriorate, and a display quality of the display device may deteriorate. Accordingly, when the display device is manufactured, a sealing process is performed so as to isolate the internal element from the outside and to prevent impurities, such as moisture, from permeating. The sealing process includes a method of sealing edges of a lower substrate and an upper substrate by using a sealant.

Recently, display devices having various functions have been developed. Among them, a display device, which serves as a display when displaying an image, and which serves as a mirror when not displaying an image, has been developed. This is referred to as a mirror-type display device. When the display device serves as a mirror, a user may view his/her image/reflection as necessary, and may observe other objects through the mirror that are desired to be viewed. For example, when the mirror-type display device is applied to a vehicle, the mirror-type display device may be applied to a side mirror or an inside mirror (e.g., rearview mirror or vanity mirror). The mirror-type display device includes a reflecting layer for reflecting light so as to serve as a mirror.

The above information disclosed in this Background section is only for enhancing understanding of the background of the invention, and therefore it may contain information that does not form prior art.

SUMMARY

The mirror-type display device including the reflecting layer may be variously applied, but when reflectance is increased, transmittance of a display image deteriorates in a display mode for displaying the image, according to the characteristics of the reflecting layer. Accordingly, the display quality of the display device may deteriorate. Further, a reflected image, as well as a displayed image, may be distorted based on the condition and state of the reflecting layer. Further, impurities, such as moisture, may permeate the display device from the outside due to the material of the reflecting layer.

One or more embodiments of the present invention are directed toward a display device including a reflecting layer, which improves a quality of a reflected image reflected in a mirror mode in which the display device serves as a mirror.

One or more embodiments of the present invention are directed toward a display device including a reflecting layer, which improves a display quality of a display image by increasing transmittance of an image displayed in a display mode.

One or more embodiments of the present invention are directed toward a display device including a reflecting layer, which prevents impurities, such as moisture, from permeating the display device from the outside along the reflecting layer.

An exemplary embodiment of the present invention provides a display device, including: a lower substrate, an upper substrate facing the lower substrate; a thin film transistor on the lower substrate; and a first reflecting layer on a first surface of the upper substrate, the first surface facing the lower substrate, wherein the lower substrate and the upper substrate include a display area for displaying an image, and a peripheral area outside the display area, and wherein the first reflecting layer is at the peripheral area, at the display area, and at an area adjacent an edge of the upper substrate.

The first reflecting layer may include one or more first openings at the peripheral area.

A portion of the one or more first openings may extend along an edge of the lower substrate or along an edge of the upper substrate.

The display device may further include a sealant at the peripheral area between the lower substrate and the upper substrate, wherein the one or more first openings may overlap at least one selected from the sealant and the peripheral area at an outer side of the sealant.

The display device may further include a second reflecting layer between the first reflecting layer and the uppers substrate.

The second reflecting layer may include one or more second openings at the peripheral area.

A portion of the one or more second openings may extend along an edge of the lower substrate or along an edge of the upper substrate.

The display device may further include a sealant at the peripheral area between the lower substrate and the upper substrate, wherein the one or more second openings may overlap at least one selected from the sealant and the peripheral area at an outer side of the sealant.

The one or more first openings may overlap at least one selected from the sealant and the peripheral area at an outer side of the sealant.

The one or more first openings may overlap the one or more second openings or may overlap the second reflecting layer.

The second reflecting layer may include one or more third openings in the display area.

The one or more third openings may overlap a unit display area, the unit display area being at the display area and at a unit area for displaying an image.

The display device may further include at least one selected from a first transparent film between the second reflecting layer and the upper substrate and a second transparent film at the second reflecting layer.

The display device may further include a sealant at the peripheral area between the lower substrate and the upper substrate, wherein the second reflecting layer may include a first part facing the sealant.

The second opening may be at both sides or may be at one side of the first part of the second reflecting layer.

The display device may further include a getter between the sealant and the display area, and between the upper substrate and the lower substrate.

The second reflecting layer may include a second part facing the getter.

The one or more second openings may be at both sides or may be at one side of the second part of the second reflecting layer.

Another exemplary embodiment of the present invention provides a display device, including: a lower substrate, an upper substrate facing the lower substrate; a thin film transistor on the lower substrate; and a reflecting layer on a first surface of the upper substrate and including one or more first openings, the first surface facing the lower substrate, wherein the lower substrate and the upper substrate includes a display area for displaying an image, and a peripheral area outside the display area, and wherein the one or more first openings are at the peripheral area.

The one or more first openings may extend along an edge of the lower substrate or along an edge of the upper substrate.

The reflecting layer may include one or more second openings in the display area.

The one or more second openings may overlap a unit display area, the unit display area being at the display area and at a unit area for displaying an image.

The display device may further include: a sealant at the peripheral area between the lower substrate and the upper substrate; and a getter between the sealant and the display area, and between the upper substrate and the lower substrate, in which the reflecting layer may include a first part facing the sealant and a second part facing the getter.

The one or more first openings may include a part at both sides or at one side of the first part of the reflecting layer, and a part at both sides or at one side of the second part of the reflecting layer.

According to the exemplary embodiments of the present invention, the display device including the reflecting layer may improve the quality of an image reflected in a mirror mode, in which the display device serves as a mirror, thereby providing a large area mirror-type display device.

According to the exemplary embodiments of the present invention, the display device including the reflecting layer may improve a display quality of an image by increasing transmittance of an image displayed in a display mode.

According to the exemplary embodiments of the present invention, the display device including the reflecting layer may prevent impurities, such as moisture, from the outside from permeating the display device along the reflecting layer.

DETAILED DESCRIPTION

Figure 1:
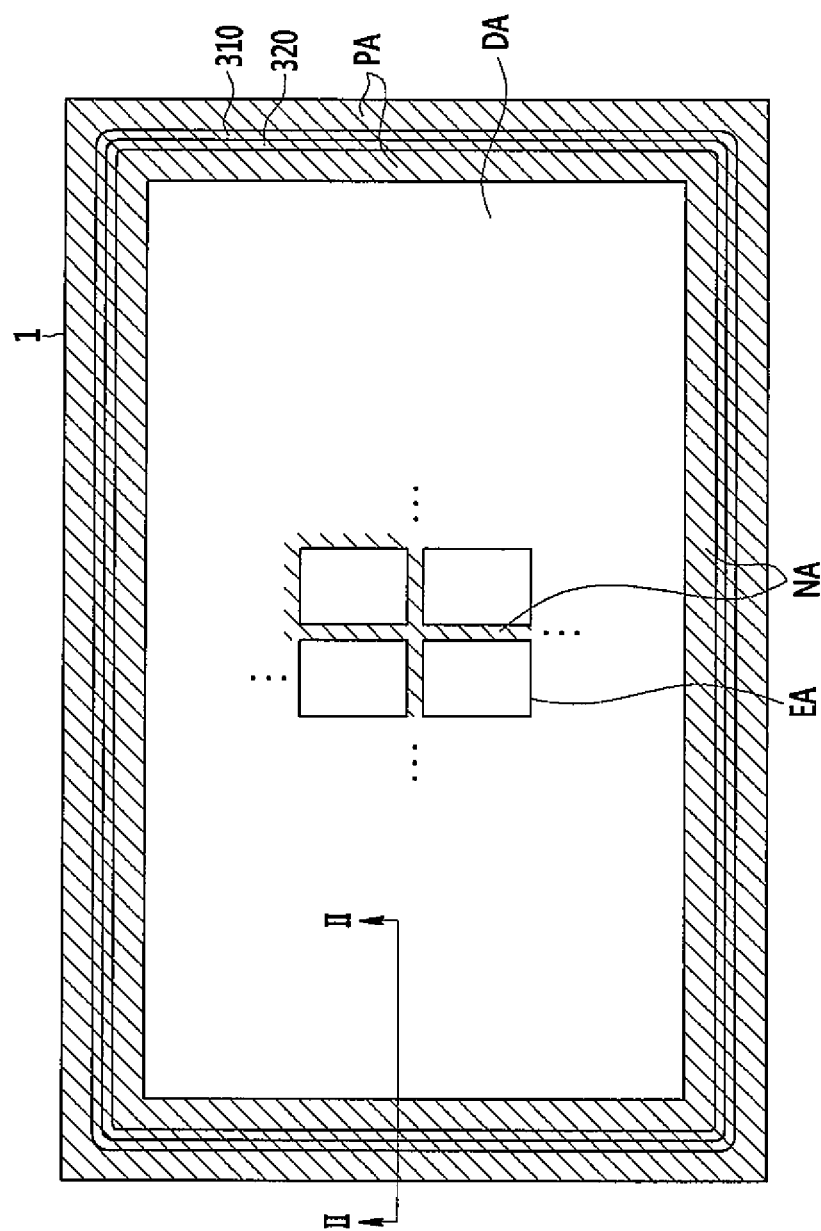
FIG. 1 is a top plan view of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification.

In describing the present invention, parts that are not related to the description may be omitted.

In addition, unless explicitly described to the contrary, the word "comprise" and variations thereof, such as "comprises" or "comprising," will be understood to imply the inclusion of stated elements, but not the exclusion of any other elements.

Expressions such as "at least one of," when preceding a list of elements, modify the entire list of elements, and do not modify the individual elements of the list. Further, the use of "may," when describing embodiments of the present invention, refers to "one or more embodiments of the present invention." It will be understood that when an element or layer is referred to as being "on," "connected to," "coupled to," or "adjacent" another element or layer, it can be directly on, connected to, coupled to, or adjacent the other element or layer, or one or more intervening elements or layers may be present. When an element or layer is referred to as being "directly on," "directly connected to," "directly coupled to," or "immediately adjacent" another element or layer, there are no intervening elements or layers present.

Spatially relative terms, such as "beneath," "below," "lower," "downward," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that, although the terms "first," "second," "third," etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section, without departing from the spirit and scope of the present inventive concept.

The terminology used herein is for the purpose of describing particular embodiments, and is not intended to be limiting of the inventive concept. As used herein, the singular forms "a" and "an" are intended to include the plural forms as well, unless the context clearly indicates otherwise. As used herein, the term "and/or" includes any and all combinations of one or more of the associated listed items. Also, the term "exemplary" is intended to refer to an example or illustration.

First, a display device according to an exemplary embodiment of the present invention will be described with reference to FIGS. 1 to 5.

Figure 2:
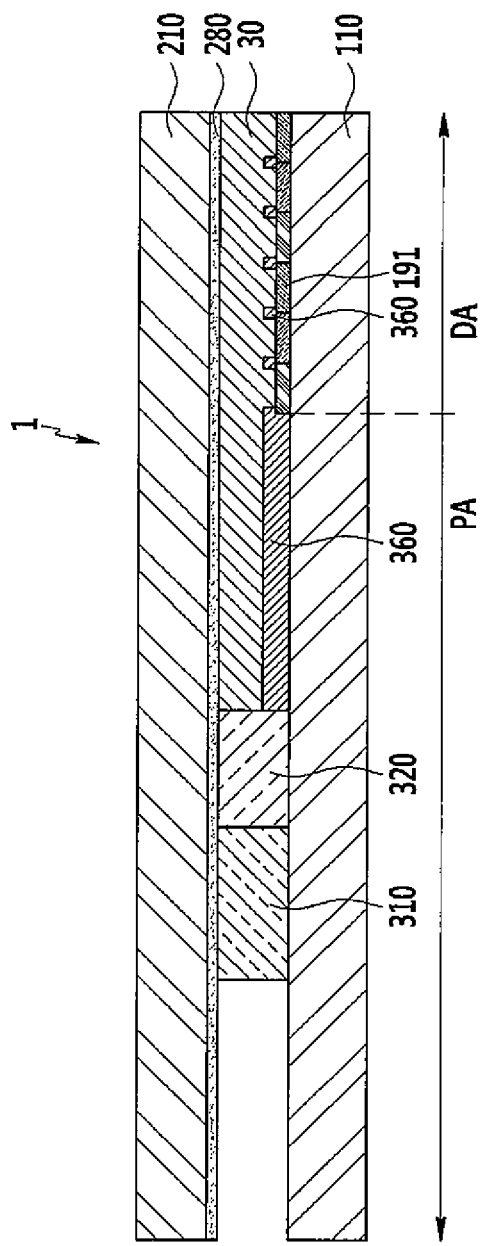
FIG. 2 is a cross-sectional view of the display device illustrated in FIG. 1 taken along the line II-II.
Figure 3:
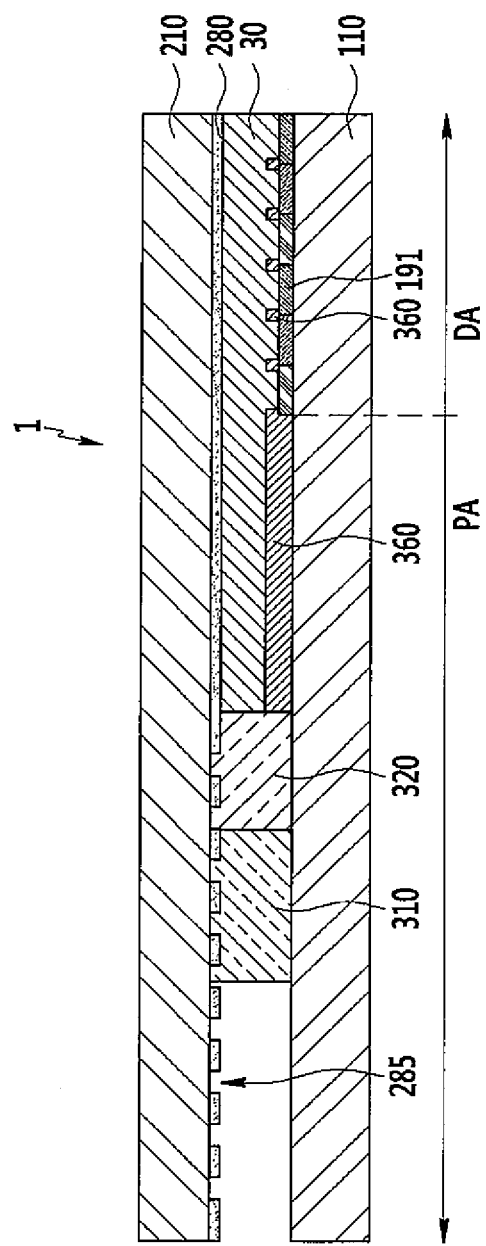
FIG. 3 is a cross-sectional view of an alternative embodiment of the display device illustrated in FIG. 1 taken along the line II-II.
Figure 4:
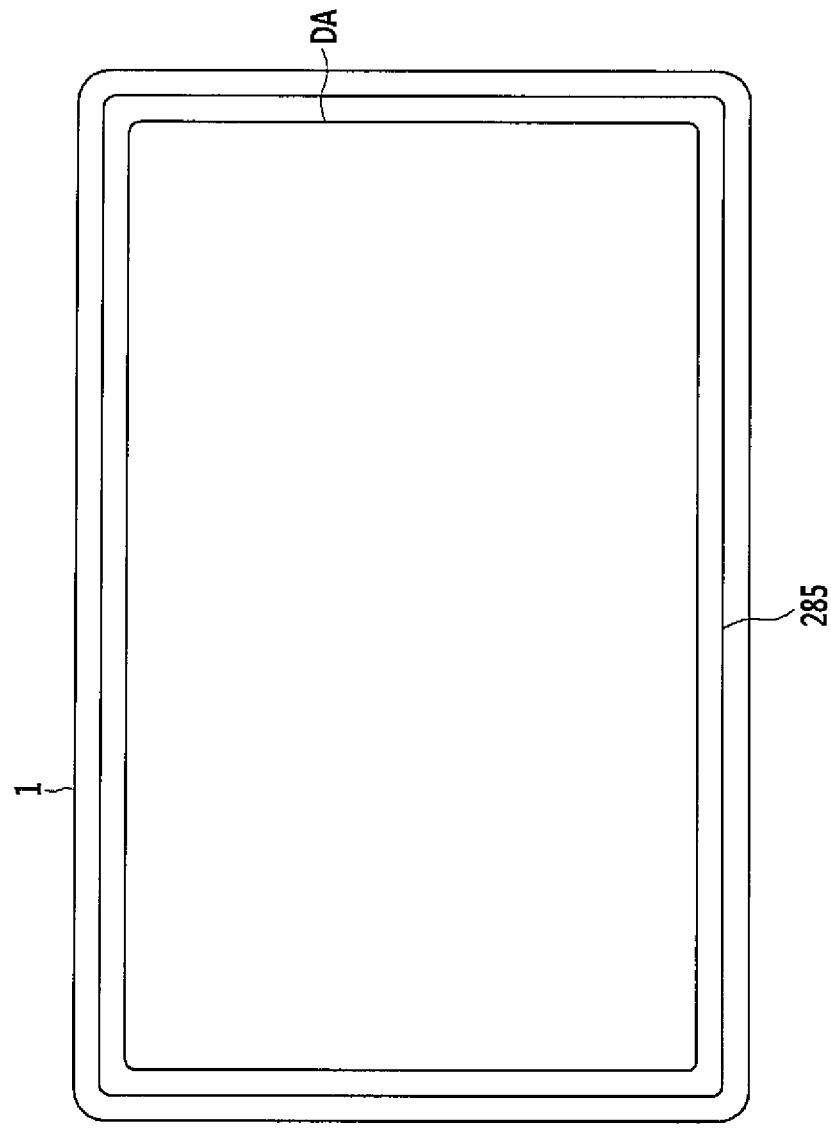
FIG. 4 is a schematic top plan view of the display device according to the alternative embodiment of FIG. 3.
Figure 5:
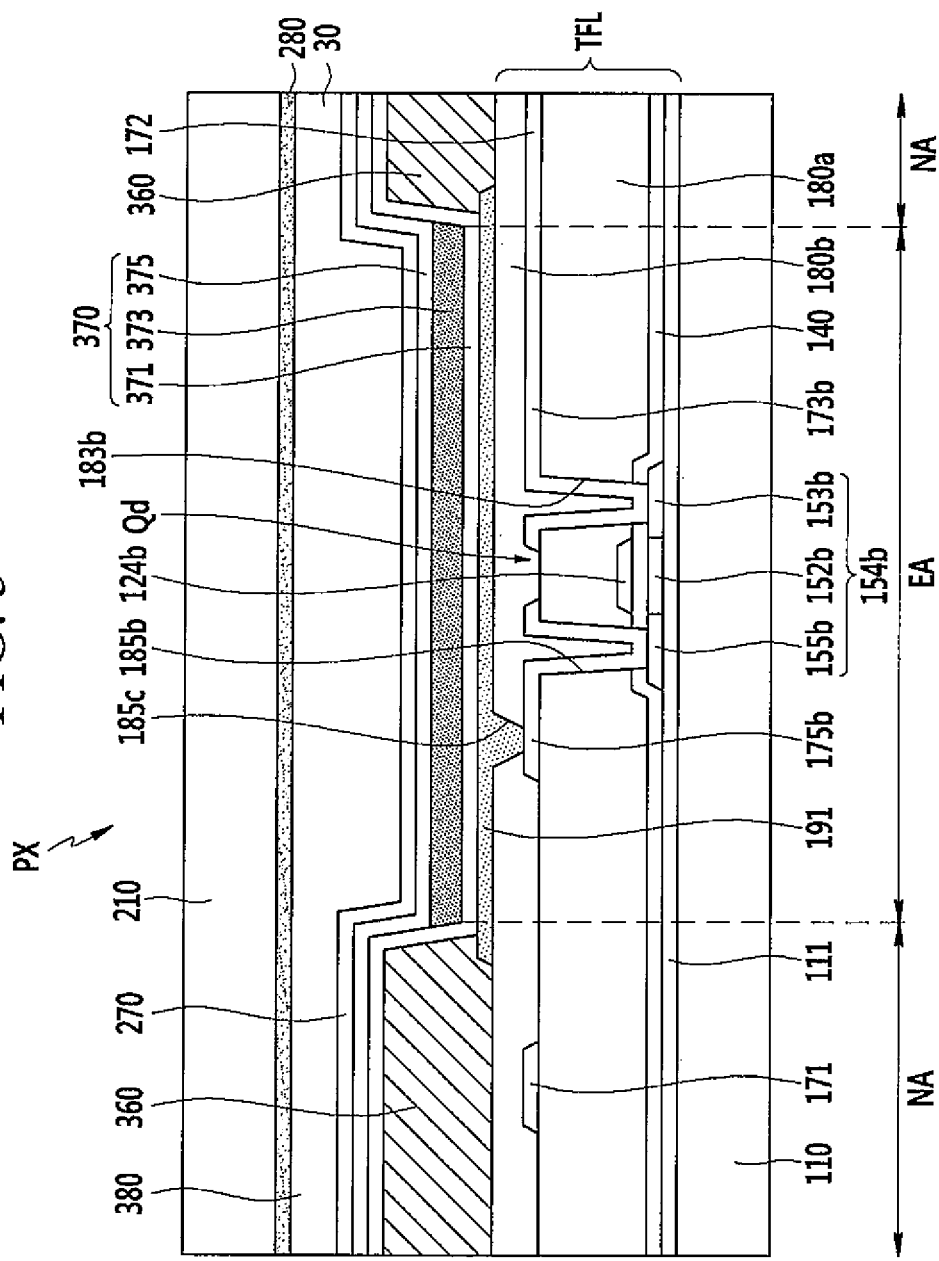
FIG. 5 is a cross-sectional view of one pixel of the display device according to the exemplary embodiment of FIG. 1.

FIG. 1 is a top plan view of a display device according to an exemplary embodiment of the present invention, FIG. 2 is a cross-sectional view of the display device illustrated in FIG. 1 taken along the line II-II, FIG. 3 is a cross-sectional view of an alternative embodiment of the display device illustrated in FIG. 1 taken along the line II-II, FIG. 4 is a schematic top plan view of the display device according to the alternative embodiment FIG. 3, and FIG. 5 is a cross-sectional view of one pixel of the display device according to the exemplary embodiment of FIG. 1.

Referring to FIG. 1, a display device 1 according to an exemplary embodiment of the present invention includes a display area DA, which is an area for displaying an image, and a peripheral area PA outside the display area DA according to a plane structure. The peripheral area PA may surround the display area DA. Referring to FIGS. 2, 3, and 5, the display device 1 according to the exemplary embodiment of the present invention includes a lower substrate 110 and an upper substrate 210, which face each other, according to a cross-sectional structure. The lower substrate 110 and the upper substrate 210 may include glass, plastic, and the like.

A plurality of signal lines, and a plurality of pixels connected to the plurality of signal lines are positioned in the display area DA, and each pixel includes a unit display area EA for displaying an image according to a corresponding image signal.

The signal lines may include a plurality of gate lines for transmitting gate signals, and a plurality of data lines for transmitting data voltages, which may be provided on the lower substrate 110. The gate lines may extend in approximately (e.g., about, or substantially) a row direction, and may extend substantially in parallel to each other, and the data lines may extend in approximately (e.g., about) a column direction and may extend substantially in parallel to each other.

The pixel positioned in the display area DA may include one or more switching elements connected to one or more signal lines, one or more pixel electrodes 191 connected with the switching element, and an opposed/opposite electrode 270 (as shown in FIG. 5) forming an electro-optical active layer, such as a light emitting device, together with the pixel electrode 191. In an organic light emitting diode display, an emission layer may be positioned between the pixel electrode 191 and the opposed electrode 270 to form a light emitting device. A liquid crystal display may include a liquid crystal layer influenced by an electric field generated between the pixel electrode 191 and the opposed electrode 270, and the pixel electrode 191, the opposed electrode 270, and the liquid crystal layer may collectively form a liquid crystal capacitor. FIGS. 2 and 3 illustrate an organic light emitting diode display as an example of the display device 1.

The switching element may include one or more thin film transistors. When a gate-on voltage is applied to the gate line, the thin film transistor may be conducted to transmit a data voltage to the pixel electrode 191. The opposed electrode 270 may transmit a common voltage.

A particular structure of the pixel will be described below with reference to FIG. 4.

The unit display area EA as shown in FIG. 1 may display an image of luminance according to a data voltage transmitted through the switching element included in a corresponding pixel. The plurality of unit display areas EA may be arranged while having regularity. For example, the plurality of unit display areas EA may be arranged in a matrix form as illustrated in FIG. 1, but is not limited thereto.

The unit display area EA corresponding to each pixel may display one among the primary colors to implement a color display, and a desired color may be viewed based on a combination of the primary colors. Examples of the primary colors may include three primary colors, such as red, green, and blue, or may include four primary colors, and/or may also include white. A color filter displaying one of the primary colors may also be positioned in the unit display area EA corresponding to each pixel PX, and the emission layer displaying the primary color may be positioned therein.

An area, except for/excluding the unit display area(s) EA, in the display device 1 may be formed as a non-display area NA. The non-display area NA includes an area positioned in the display area DA, and an area positioned in the peripheral area PA. The non-display area NA positioned in the display area DA includes a surrounding area of the unit display area EA, that is, an area between adjacent unit display areas EA. The non-display area NA positioned in the peripheral area PA may have a form surrounding the display area DA, but is not limited thereto. A light blocking member for blocking transmittance of light may or may not be positioned in the non-display area NA. When the display device 1 is transparent, the unit display area EA and/or the non-display area NA may have transparency.

Several signal lines connected with the display area DA may be positioned in the peripheral area PA, and one or more driving units for driving the pixel PX may be positioned in the peripheral area PA.

A sealant 310 may be positioned in the peripheral area PA, as shown in FIGS. 1-3. The sealant 310 is positioned between the lower substrate 110 and the upper substrate 210 to combine and affix the lower substrate 110 and the upper substrate 210. The sealant 310 may protect the electro-optical active layer, such as the light emitting device and the like, and may protect the pixel PX by blocking impurities, such as moisture and oxygen, from permeating from the outside to a space between the lower substrate 110 and the upper substrate 210.

The sealant 310 may form a looped curve surrounding the display area DA, as seen in FIG. 1. The sealant 310 may also include a frit having an excellent moisture-proofing property, and may include an organic sealant and a moisture absorber. The sealant 310 may combine the lower substrate 110 and the upper substrate 210 when the sealant 310 is positioned between the lower substrate 110 and the upper substrate 210 and when heat is then applied. In this case, heat may be applied to the sealant 310 by using an infrared lamp, laser, or the like. By contrast, the sealant may include a light absorber capable of absorbing laser, infrared rays, or the like. Particularly, the frit may be used by inserting oxide powder into glass powder, or may include an organic material to make the frit into a paste. When the frit is melted by applying heat to the frit applied between the lower substrate 110 and the upper substrate 210, the lower substrate 110 and the upper substrate 210 may be bonded to each other through the sintered frit, and internal elements of the display device may be completely sealed.

Referring to FIGS. 1 to 3, the display device 1 may further include a getter 320 positioned in the peripheral area PA, and positioned between the sealant 310 and the display area DA. The getter 320 may be formed while being in contact with the sealant 310 as illustrated in FIGS. 1 to 3, or may be spaced apart from the sealant 310. The getter 320 may form a looped curve surrounding the display area DA. The getter 320 may adsorb moisture or oxygen permeating through the sealant 320 to prevent moisture or oxygen from permeating the display area DA.

Referring to FIGS. 2 and 3, in the organic light emitting diode display, a pixel defining layer 360 may be positioned on the pixel electrode 191.

The pixel defining layer 360 positioned in the display area DA may include a plurality of openings to define the unit display area EA corresponding to each pixel PX. The pixel defining layer 360 in the display area DA may be formed so as to correspond to the non-display area NA.

The pixel defining layer 360 positioned in the peripheral area PA may be positioned between the sealant 310 or the getter 320 and the display area DA. In some embodiments, a part of the sealant 310 may also overlap the pixel defining layer 360 positioned in the peripheral area PA.

The pixel defining layer 360 may be made of a resin, such as a polyacrylate resin and polyimides, or may be made of silica-based inorganic materials.

Referring to FIGS. 2 and 3, a filler 30 may be filled in a space between the pixel defining layer 360 and the upper substrate 210. The filler 30 may absorb external impact, and may uniformly maintain an interval between the upper substrate 210 and the lower substrate 110. The filler 30 may be formed of a material having high transmittance, and for example, may include a resin based on epoxy, polyimide, urethane acrylate, epoxy acrylate, or silicon.

An example of a particular structure of the pixel of the display device 1 according to the exemplary embodiment of the present invention will be described with reference to FIG. 5 together with FIGS. 1 to 3. Here, the organic light emitting diode display is described as an example, but the structure of the display device 1 is not limited thereto.

Referring to FIG. 5, a buffer layer 111 may be positioned on the lower substrate 110. The buffer layer 111 may prevent impurities from permeating, and a surface of the buffer layer 111 may be flat. The buffer layer 111 may include silicon nitride (SiNx), silicon oxide ($SiO_2$), silicon oxynitride (SiOxNy), and/or the like. The buffer layer 111 may instead be omitted in other embodiments.

At least one semiconductor layer is positioned on the buffer layer 111. The semiconductor layer includes a first semiconductor 154b positioned in the display area DA. The first semiconductor 154b may include a channel area (e.g., a channel) 152b, a source area (e.g., a source) 153b, and a drain area (e.g., a drain) 155b, the source area 153b and the drain area 155b being positioned at respective sides of the channel area 152b, and being formed while being doped. The semiconductor layer may include amorphous silicon, polycrystal silicon, and/or an oxide semiconductor.

A gate insulation layer 140, which may be formed of silicon nitride (SiNx) and/or silicon oxide ($SiO_2$), is positioned on the semiconductor layer.

A plurality of gate conductors are positioned on the gate insulating layer 140. The gate conductors include a first control electrode 124b positioned in the display area DA. The first control electrode 124b may overlap a part, particularly, the channel area 152b, of the first semiconductor 154b.

A first passivation layer 180a is positioned on the gate insulating layer 140 and the gate conductor. The first passivation layer 180a and the gate insulating layer 140 may include a contact opening (e.g., a contact hole) 183b exposing the source area 153b, and a contact opening (e.g., a contact hole) 185b exposing the drain area 155b of the first semiconductor 154b in the display area DA.

The plurality of data conductors is positioned on the first passivation layer 180a. The data conductors may include a plurality of data lines 171, a driving voltage line, and a plurality of first output electrodes 175b. The driving voltage line may include a plurality of first input electrodes 173b that transmit a driving voltage and may extend toward the first control electrode 124b. The first output electrode 175b faces the first input electrode 173b on the first semiconductor 154b. The first input electrode 173b and the first output electrode 175b may be connected with the source area 153b and the drain area 155b of the first semiconductor 154b through the contact holes 183b and 185b, respectively.

The first control electrode 124b, the first input electrode 173b, and the first output electrode 175b collectively form a switching element that is a thin film transistor together with the first semiconductor 154b.

A second passivation layer 180b including an inorganic insulating material and/or an organic insulating material is positioned on the data conductors. The second passivation layer 180b may have a flat surface. The second passivation layer 180b may have a contact opening (e.g., a contact hole) 185c exposing the first output electrode 175b.

A pixel electrode layer is positioned on the second passivation layer 180b. The pixel electrode layer includes a pixel electrode 191 positioned in the pixel PX of the display area DA. The pixel electrode 191 is physically and electrically connected with a first output electrode 175*b* through the contact hole 185*c* of the second passivation layer 180*b*. The pixel electrode layer may include a semi-transmissive conductive material or a reflective conductive material. The pixel electrode 191 and the unit display area EA may overlap each other, but the present invention is not limited thereto.

The layers formed on the lower substrate 110, for example, the layers from the buffer layer 111 to the second passivation layer 180*b*, are referred to as a transistor layer TFL.

A pixel defining layer 360 is positioned on the second passivation layer 180*b* and the pixel electrode layer.

An emission member (e.g., emission layer) 370 is positioned on the pixel defining layer 360 and on the pixel electrode 191. Referring to FIG. 5, the emission member 370 may include a first organic common layer 371, a plurality of emission layers 373, and a second organic common layer 375, which are sequentially stacked.

The first organic common layer 371 may include at least one selected from, for example, a hole injecting layer and a hole transport layer which are sequentially stacked. The first organic common layer 371 may be formed over the entire surface of the display area DA, and may also be limitedly formed in the unit display area EA corresponding to each pixel PX.

The emission layer 373 may be positioned on the pixel electrode 191 of each corresponding pixel PX. The emission layer 373 may be positioned so as to correspond to the unit display area EA of each pixel PX. The emission layer 373 may be formed of an organic material uniquely emitting light of the primary colors, such as red, green, and blue, and may have a structure in which a plurality of organic material layers emitting light of different colors are stacked. According to the exemplary embodiment of the present invention, the emission layer 373 may also include a white emission layer displaying white.

The second organic common layer 375 may include at least one selected from, for example, an electron transport layer and an electron injecting layer, which are sequentially stacked. At least one selected from the first organic common layer 371 and the second organic common layer 375 may be omitted.

The opposed electrode 270 transmitting the common voltage ELVSS is positioned on the emission member 370. The opposed electrode 270 may include a transparent conductive material. For example, when the opposed electrode 270 includes a metal, such as calcium (Ca), barium (Ba), magnesium (Mg), aluminum (Al), and/or silver (Ag), a metal layer may be formed to be thin, so as to allow light transmission.

The pixel electrode 191, the emission member 370, and the opposed electrode 270 of each pixel PX form the light emitting device, and one of the pixel electrode 191 and the opposed electrode 270 is a cathode, while the other is an anode.

The display device 1 may display an image in a direction in which an outer surface of the upper substrate 210 faces.

Referring to FIGS. 2 to 5, one or more reflecting layers are positioned on an inner surface of the upper substrate 210 facing the lower substrate 110, the one or more reflecting layers including a first reflecting layer 280. The first reflecting layer 280 may have reflectivity, so that the display device 1 reflects light to serve as a mirror when the display device 1 does not display an image.

In some embodiments, the first reflecting layer 280 may reflect light in the visible light region of the light spectrum. For example, the first reflecting layer 280 may include a metal capable of reflecting light in a visible light region, and may include at least one metal, such as aluminum (Al), silver (Ag), chrome (Cr), molybdenum (Mo), iron (Fe), platinum (Pt), mercury (Hg), nickel (Ni), tungsten (W), and/or vanadium (V).

The first reflecting layer 280 may include only a metal layer, or in other embodiments, may further include a reflective polarizing plate in addition to the metal layer.

The first reflecting layer 280 may have a different transmittance according to its thickness, and the transmittance may be determined by considering the luminance of an image displayed when each pixel PX displays the image. For example, reflectivity of the first reflecting layer 280 may be about 50% to about 90%, but is not limited thereto.

Referring to FIGS. 2 and 5, the first reflecting layer 280 according to the exemplary embodiment of the present invention is substantially formed on the entire inner surface of the upper substrate 210. That is, the first reflecting layer 280 is formed to, or up to, an edge of the upper substrate 210, and may even be positioned in an area just adjacent the edge. Accordingly, the first reflecting layer 280 is positioned in both of the peripheral area PA and the display area DA in the display device 1, so that the entire surface of the display device 1 may function as a mirror. Accordingly, it is possible to improve a quality of an image reflected by the display device 1 in mirror mode.

Referring to FIGS. 3 and 4, the first reflecting layer 280 according to the alternative embodiment of the present invention is formed on the entire inner surface of the upper substrate 210 (e.g., identically to the first reflecting layer 280 according to the exemplary embodiment illustrated in FIGS. 2 and 5), but may include one or more openings 285 positioned in the peripheral area PA. Accordingly, the first reflecting layer 280 has discontinuity, thereby preventing impurities, such as moisture, from the outside from propagating along the first reflecting layer 280. The openings 285 may be formed so as to correspond to at least one selected from the getter 320, the sealant 310, and the peripheral area PA positioned at an outer side of the sealant 310. The openings 285 might not be formed in the peripheral area PA and the display area DA positioned at an inner side of the getter 320. That is, the first reflecting layer 280 may be substantially and continuously formed within an area surrounded by the getter 320. However, the first reflecting layer 280 is not limited thereto, and the first reflecting layer 280 may further include an opening positioned at a part such as, for example, a part corresponding to the pixel defining layer 360 or corresponding to a partial area of the display area DA.

The openings 285 of the first reflecting layer 280 may be sized such that the openings 285 cannot be viewed/seen from the outside in mirror mode.

Referring to FIG. 4, the openings 285 may generally extend in parallel to an edge of the lower substrate 110 or an edge of the upper substrate 210. Further, the openings 285 may be formed along an area surrounding the display area DA, as illustrated in FIG. 4, and may also form a looped curve. However, a shape of the openings 285 is not limited to the illustration.

Figure 6:
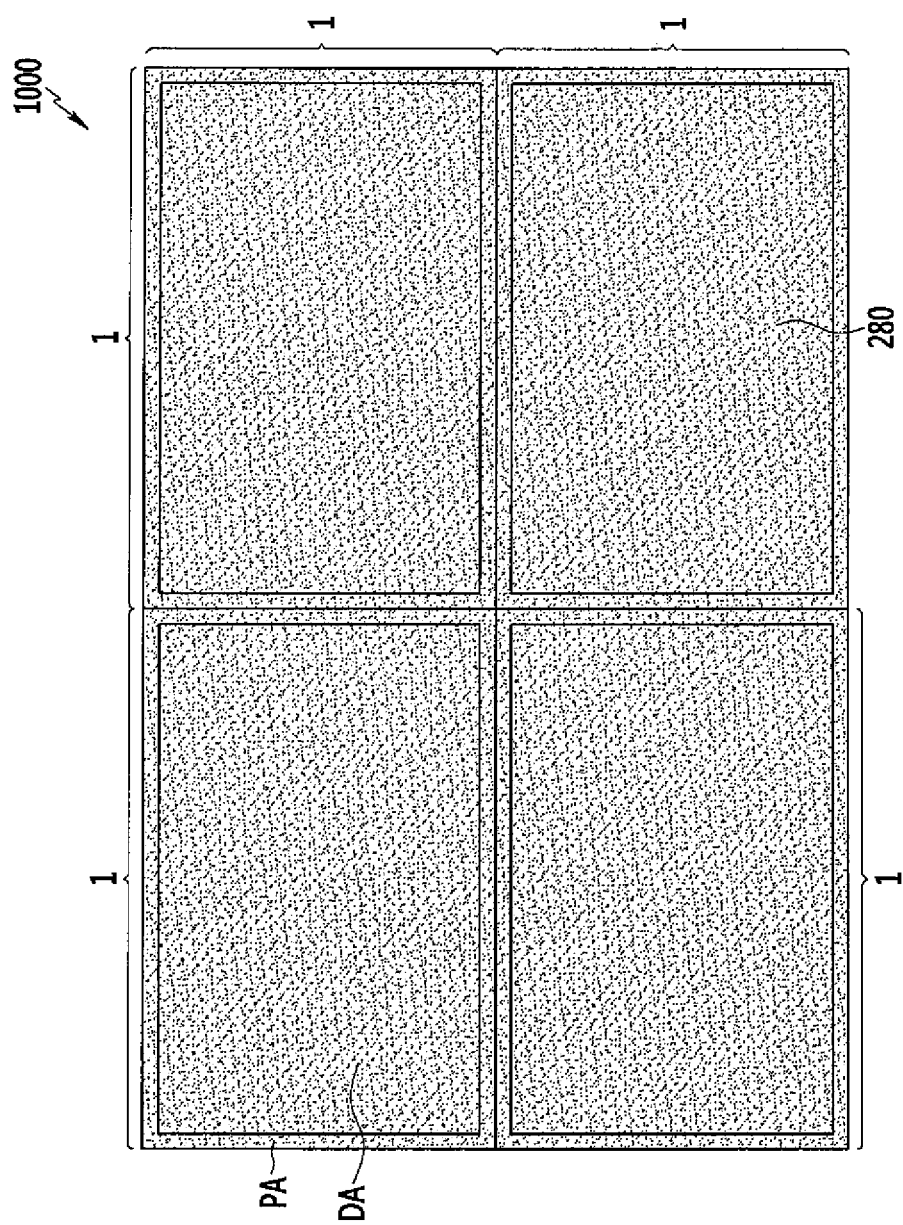
FIG. 6 is a top plan view of a tiled display device formed by connecting a plurality of display devices according to an exemplary embodiment of the present invention.

FIG. 6 is a top plan view of a tiled display device formed by connecting a plurality of display devices according to the exemplary embodiment of the present invention.

Referring to FIG. 6, a tiled display device 1000 having a large area may be formed by connecting the plurality of display devices 1 in a tile form, according to the exemplary embodiment of the present invention. One tiled display device 1000 may include an even-number of display devices 1. According to the exemplary embodiment of the present invention, the first reflecting layer 280 is positioned on the entire inner surface of the upper substrate 210 of the display device 1, so that the first reflecting layer 280 is substantially positioned on the entire tiled display device 1000 without discriminating between the display area DA and the peripheral area PA. Accordingly, when the tiled display device 1000 performs the mirror function, the entire tiled display device 1000 may serve as a mirror, so that a large area mirror display device having an improved quality of the image reflected in mirror mode may be implemented.

A display device according to another exemplary embodiment of the present invention will be described with reference to FIGS. 7 to 9 together with the aforementioned described drawings. The same constituent elements as those of the aforementioned exemplary embodiment are denoted by the same reference numerals, and common description may be omitted.

Figure 7:
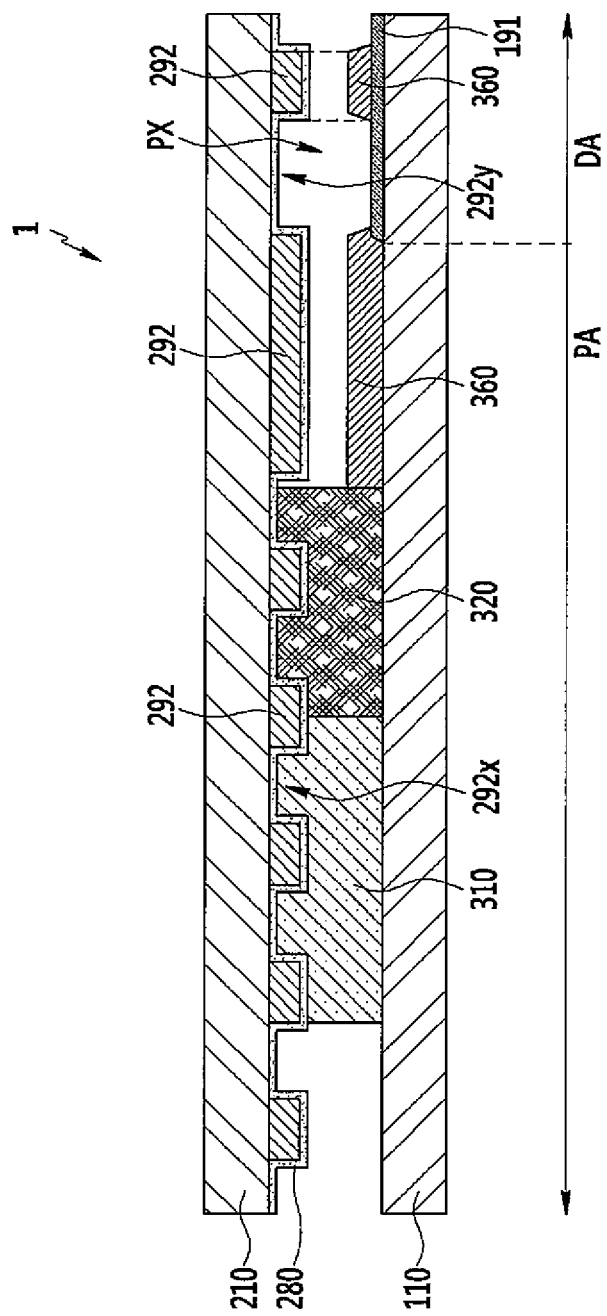
FIG. 7 a cross-sectional view of a further exemplary embodiment of the display device illustrated in FIG. 1 taken along the line II-II.
Figure 8:
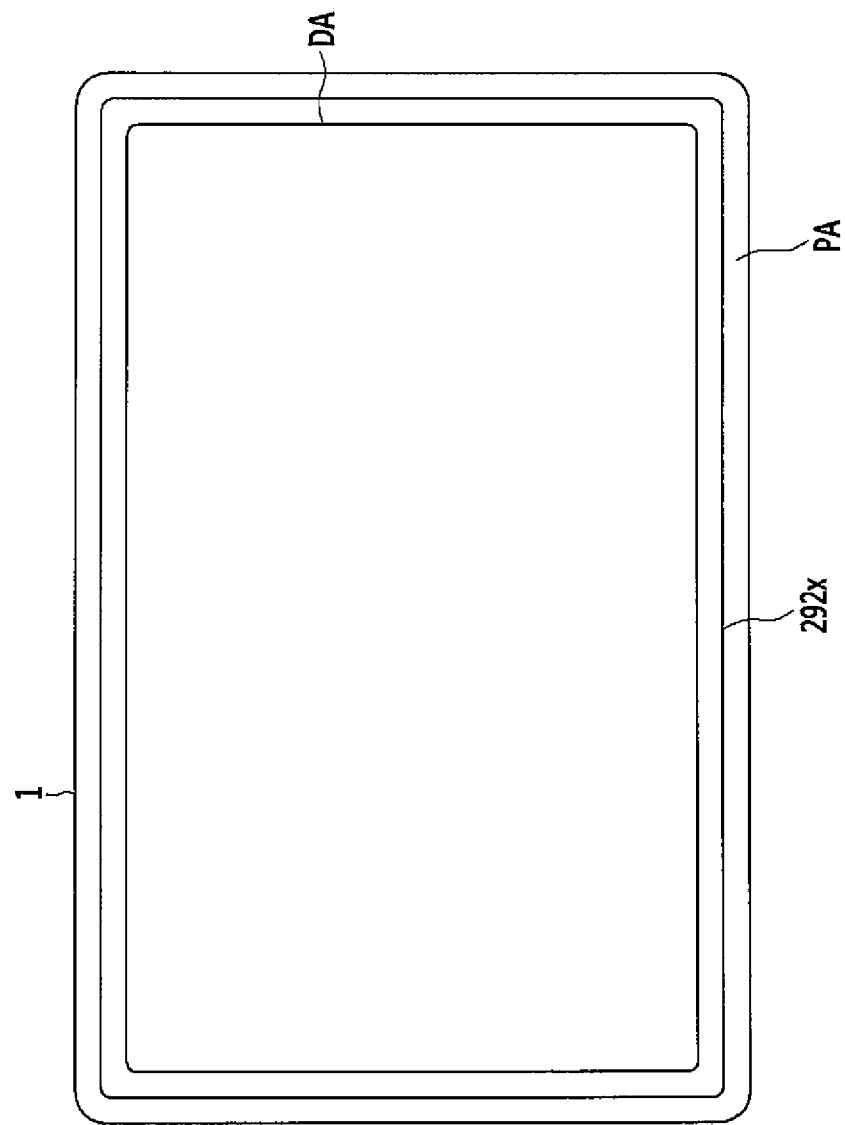
FIG. 8 is a schematic top plan view of the display device according to the further exemplary embodiment of FIG. 7.
Figure 9:
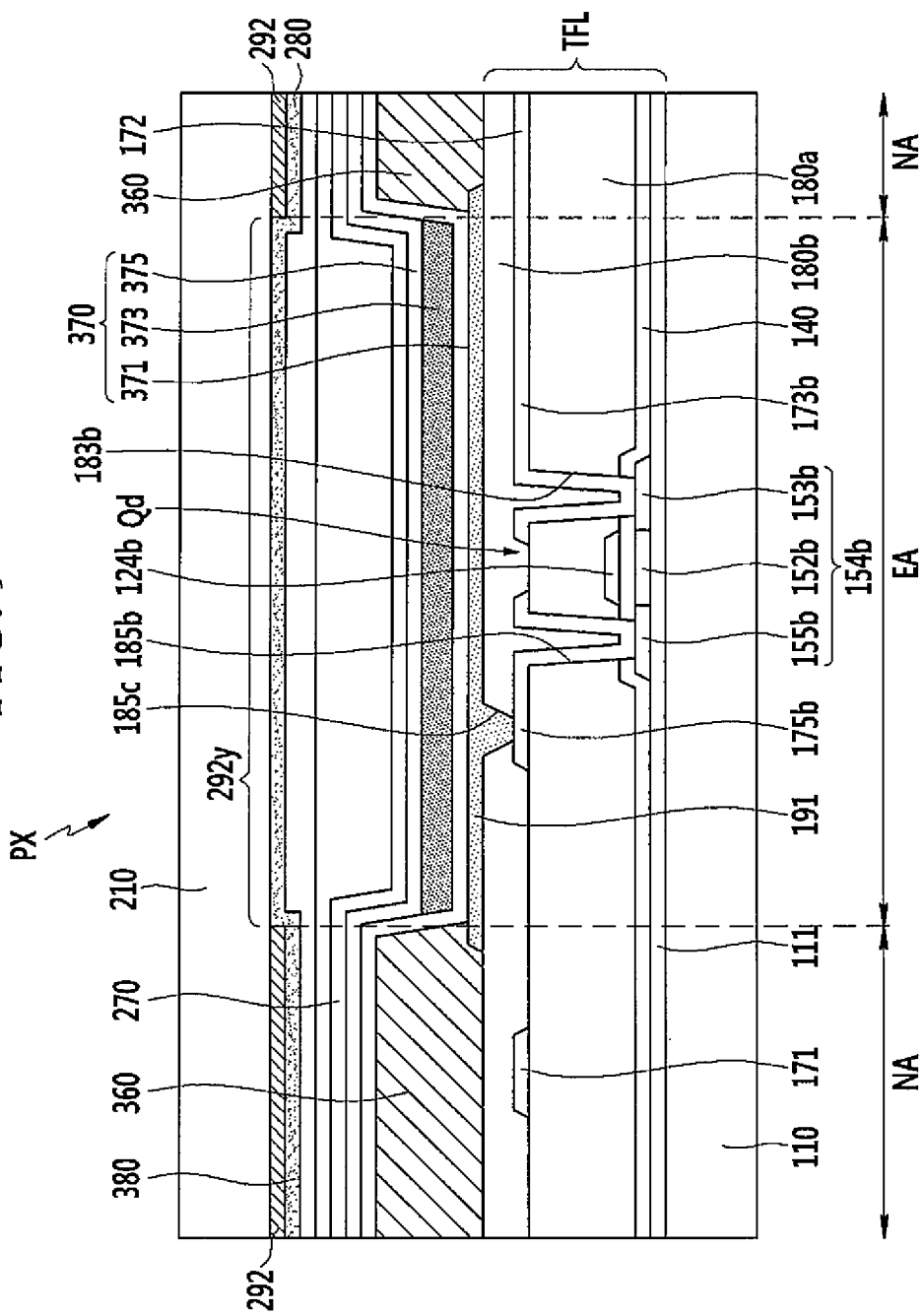
FIG. 9 is a cross-sectional view of one pixel of the display device according to the further exemplary embodiment of FIG. 7.

FIG. 7 is a cross-sectional view of a further exemplary embodiment of the display device illustrated in FIG. 1 taken along the line II-II, FIG. 8 is a schematic top plan view of the display device according to the further exemplary embodiment of FIG. 7, and FIG. 9 is a cross-sectional view of one pixel of the display device according to the further embodiment of FIG. 7.

A display device 1 according to another exemplary embodiment of the present invention is mostly the same as the display device according to the aforementioned exemplary embodiment of the present invention, but may further include a second reflecting layer 292 positioned between an upper substrate 210 and a first reflecting layer 280. The second reflecting layer 292 may have reflectivity, so that the display device 1 reflects light from an external object to serve as a mirror when the display device 1 does not display an image.

Particularly, the second reflecting layer 292 may reflect light in a visible light region of the light spectrum. For example, the second reflecting layer 292 may include a metal capable of reflecting light of the visible light region, and may include at least one metal, such as aluminum (Al), silver (Ag), chrome (Cr), molybdenum (Mo), iron (Fe), platinum (Pt), mercury (Hg), nickel (Ni), tungsten (W), and/or vanadium (V).

The second reflecting layer 292 may include the same material as, or a different material from, that of the first reflecting layer 280. Transmittance of the second reflecting layer 292 may be the same as, or different from, transmittance of the first reflecting layer 280. When the transmittance of the second reflecting layer 292 is different from transmittance of the first reflecting layer 280, the transmittance of the second reflecting layer 292 may be lower than the transmittance of the first reflecting layer 280.

A thickness of the second reflecting layer 292 may be different from a thickness of the first reflecting layer 280, and more particularly, the thickness of the second reflecting layer 292 may be greater than the thickness of the first reflecting layer 280. For example, the thickness of the second reflecting layer 292 may have the thickness of about 300 Å or more. In this case, a thickness of the first reflecting layer 280 may be about 300 Å or less.

The second reflecting layer 292 may be patterned to have one or more openings 292x and 292y.

Particularly, the second reflecting layer 292 may include the openings 292x positioned in a peripheral area PA. The plurality of openings 292x spaced apart from each other may be positioned in the peripheral area PA. The openings 292x may be formed so as to correspond to at least one selected from a getter 320, a sealant 310, and the peripheral area PA positioned at an outer side of the sealant 310. Widths of the openings 292x and/or an interval between the openings 292x may be uniform or may be different according to the positions of the openings 292x.

Referring to FIG. 8, the openings 292x may generally extend in parallel to an edge of the lower substrate 110 or an edge of the upper substrate 210. Further, the openings 292x may be formed along an area surrounding a display area DA, and may form a looped curve. However, a shape of the openings 292x is not limited to the illustration.

Referring to FIG. 7, the openings 292x might not be substantially formed in the peripheral area PA positioned at an inner side of the getter 320. That is, the second reflecting layer 292 may be substantially and continuously formed in an area positioned between the getter 320 and the display area DA. However, the second reflecting layer 292 is not limited thereto, and the second reflecting layer 292 may further include an opening positioned at other parts, for example, a part corresponding to the pixel defining layer 360 or corresponding to a partial area of the display area DA.

The openings 292x of the second reflecting layer 292 provide discontinuity to the second reflecting layer 292, so that it is possible to prevent impurities from the outside, such as moisture, from propagating along the second reflecting layer 292.

Referring to FIGS. 7 and 9, the second reflecting layer 292 may include the openings 292y positioned in the display area DA. The openings 292y may be positioned so as to correspond to the unit display area EA. Accordingly, the second reflecting layer 292 may be patterned to be positioned so as to correspond to the non-display area NA in the display area DA. In this case, the second reflecting layer 292 may be formed to mostly overlap the pixel defining layer 360 in the display area DA.

According to the exemplary embodiment of the present invention, the first reflecting layer 280 may be formed in most/a majority of the display area DA including the unit display area EA, but transmittance of the first reflecting layer 280 is larger than that of the second reflecting layer 292, so that it is possible to improve a display quality of an image by improving transmittance of an image (e.g., a display image) in a display mode in which the pixel PX displays an image. When the display device 1 performs a mirror function, the second reflecting layer 292 having higher reflectivity than that of the first reflecting layer 280 may serve as the main mirror, and the first reflecting layer 280 may serve as an auxiliary/secondary mirror. Accordingly, when the display device 1 further includes the second reflecting layer 292 as described in the further exemplary embodiment of the present invention, it is possible to further improve reflectivity in a mirror mode as compared to the display device including only the first reflecting layer 280.

The display device according to another exemplary embodiment of the present invention will be described with reference to FIGS. 10 and 11 together with the aforementioned drawings.

Figure 10:
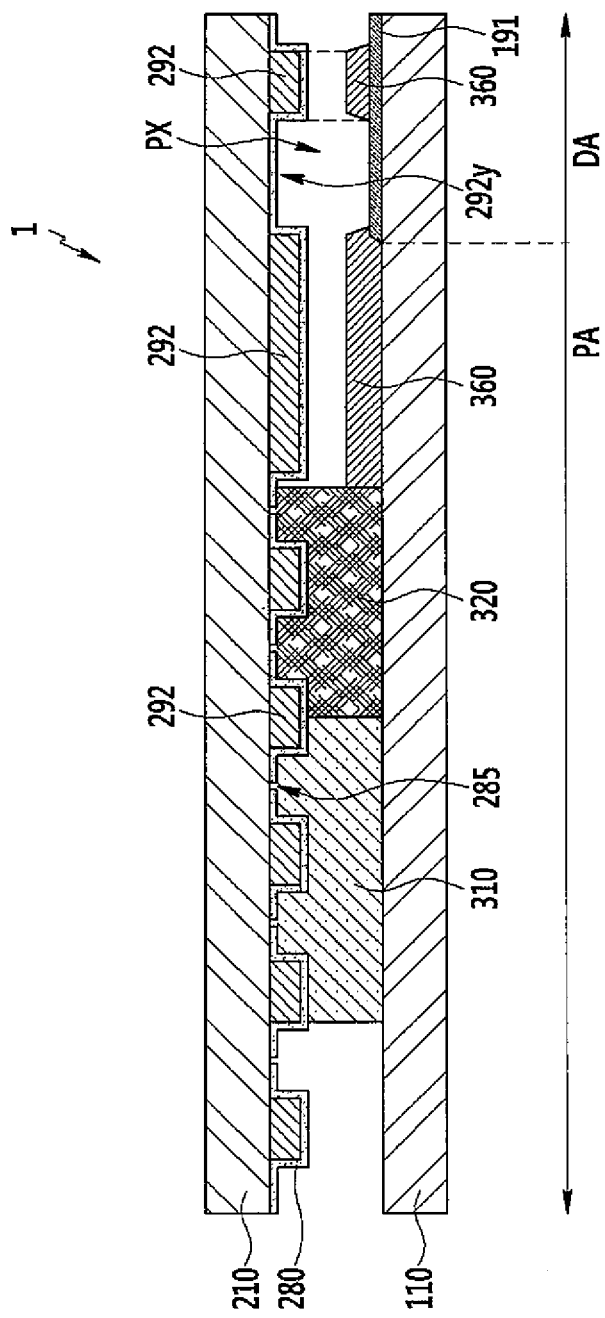
FIG. 10 is a cross-sectional view of a further embodiment of the display device illustrated in FIG. 1 taken along the line II-II.
Figure 11:
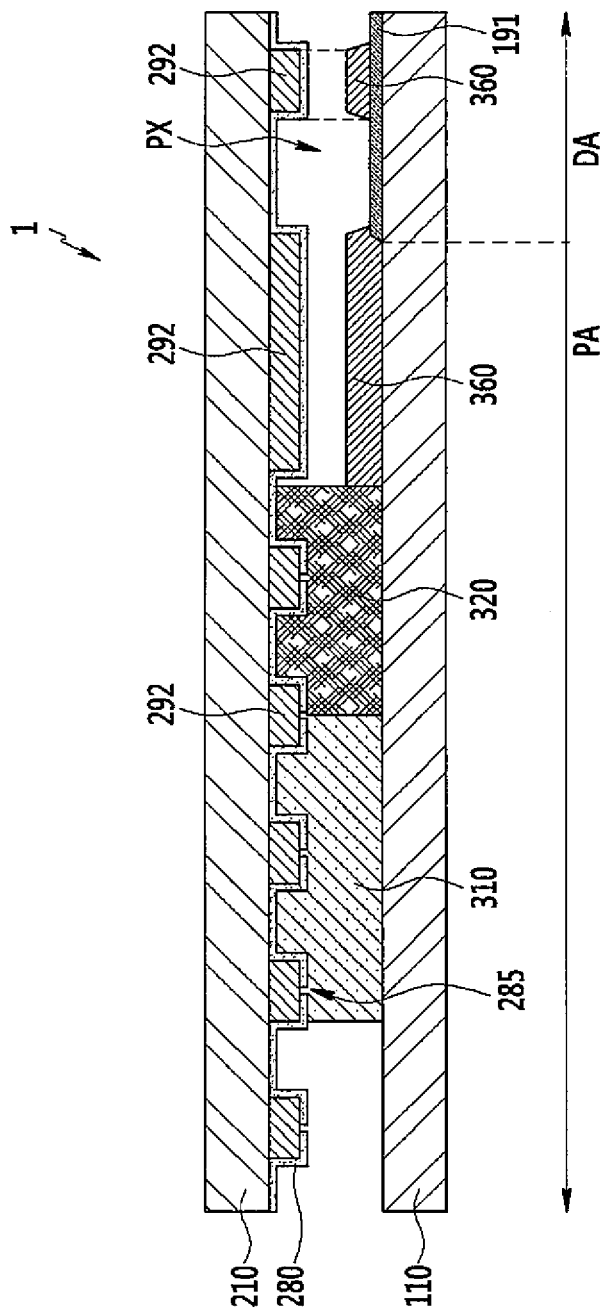
FIG. 11 is a cross-sectional view of yet another embodiment of the display device illustrated in FIG. 1 taken along the line II-II.

FIG. 10 is a cross-sectional view of a further embodiment of the display device illustrated in FIG. 1 taken along the line II-II, and FIG. 11 is a cross-sectional view of yet another embodiment of the display device illustrated in FIG. 1 taken along the line II-II.

Referring to FIGS. 10 and 11, a display device 1 according to these embodiments of the present invention are mostly the same as the display device according to the aforementioned exemplary embodiment illustrated in FIGS. 7 to 9, but a first reflecting layer 280 may include one or more openings 285 positioned in a peripheral area PA. Accordingly, the first reflecting layer 280 is discontinuous, thereby preventing impurities from the outside, such as moisture, from propagating along the first reflecting layer 280. The openings 285 may be formed so as to correspond to at least one selected from a getter 320, a sealant 310, and a peripheral area PA positioned at an outer side of the sealant 310. The openings 285 might not be formed in the peripheral area PA and in a display area DA positioned at an inner side of the getter 320. That is, the first reflecting layer 280 may be substantially and continuously formed within an area surrounded by the getter 320.

The openings 285 of the first reflecting layer 280 may be sized such that the openings 285 cannot be viewed from the outside in mirror mode. As illustrated in FIG. 4, the openings 285 may generally extend in parallel to an edge of a lower substrate 110 or to an edge an upper substrate 210. Further, the openings 285 may be formed along an area surrounding the display area DA and may form a looped curve.

A size of each opening 285 may be smaller than a size of an opening 292x or an opening 292y of a second reflecting layer 292.

Referring to FIG. 10, the openings 285 may be positioned between two adjacent portions of the second reflecting layer 292. That is, the openings 285 may be positioned in a part that does not overlap the second reflecting layer 292. Further, as illustrated in FIG. 10, the openings 285 may be positioned in all of the areas of the peripheral area PA, in which the openings 292x of the second reflecting layer 292 are positioned. In other embodiments, the openings 285 may be positioned only in areas corresponding to some of the plurality of openings 292x.

Referring to FIG. 11, the openings 285 may be positioned at a part corresponding to the second reflecting layer 292. That is, the openings 285 may overlap the second reflecting layer 292. Further, as illustrated in FIG. 11, the openings 285 may be positioned on each portion of the second reflecting layer 292 that is adjacent an opening 292x in the peripheral area PA. In other embodiments, the openings 285 may be positioned only in areas corresponding to some of the portions of the second reflecting layer 292 that are adjacent an opening 292x. When the openings 295 are positioned at the parts overlapping the second reflecting layer 292 as described above, it is possible to minimize an area, which cannot perform a mirror function, thereby improving a quality of an image reflected in mirror mode.

The display device according to another exemplary embodiment of the present invention and a method of manufacturing the same will be described with reference to FIGS. 12 and 19 together with the aforementioned drawings.

Figure 12:
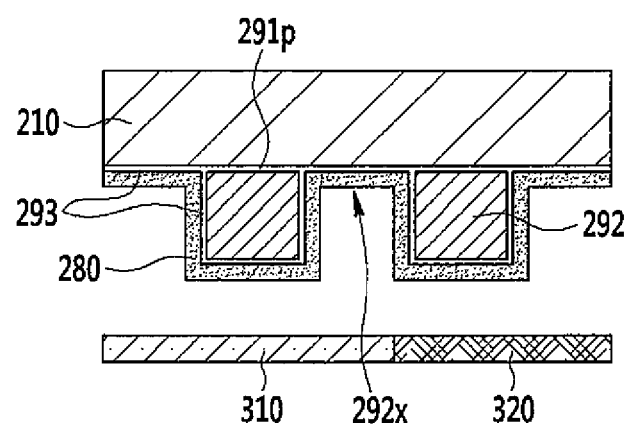
FIGS. 12, 13, and 14 are cross-sectional views of peripheral areas of display devices according to other exemplary embodiments of the present invention.
Figure 13:
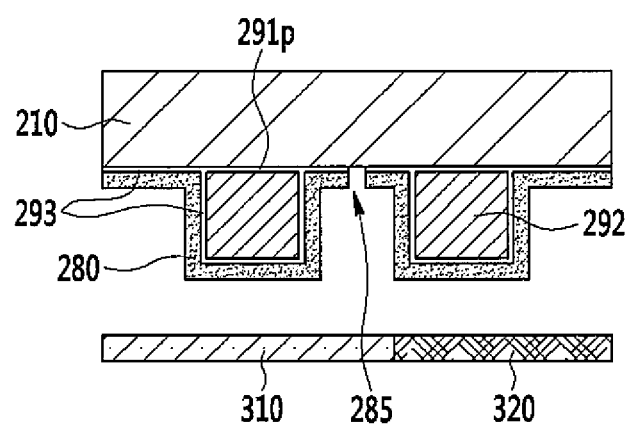
Figure 14:
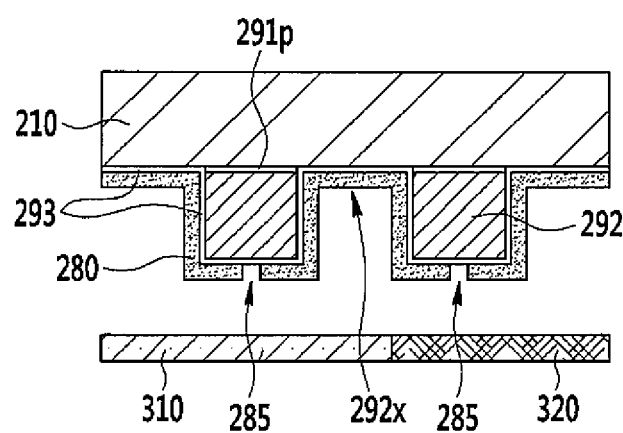
Figure 15:
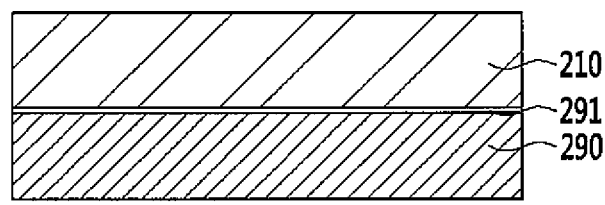
FIGS. 15 and 16 sequentially illustrate a cross-sectional structure of an intermediate product in a manufacturing process of a method of manufacturing the display device according to an exemplary embodiment of the present invention.
Figure 16:
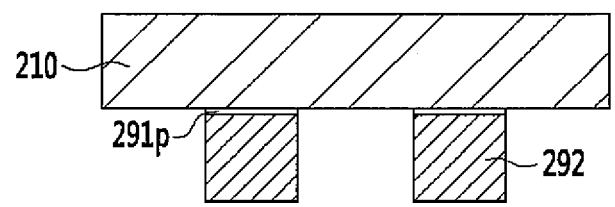
Figure 17:
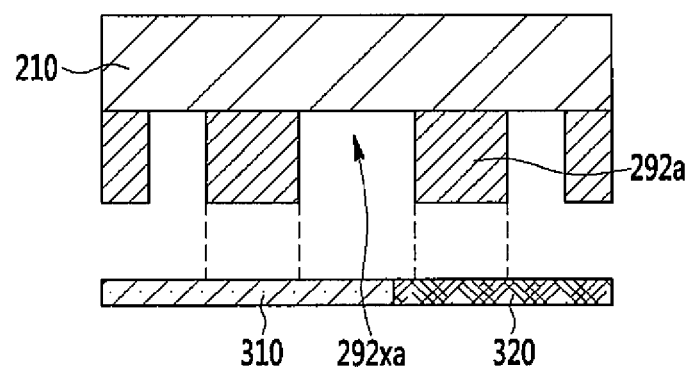
FIGS. 17, 18, and 19 are cross-sectional views of peripheral areas of display devices according to other exemplary embodiments of the present invention.
Figure 18:
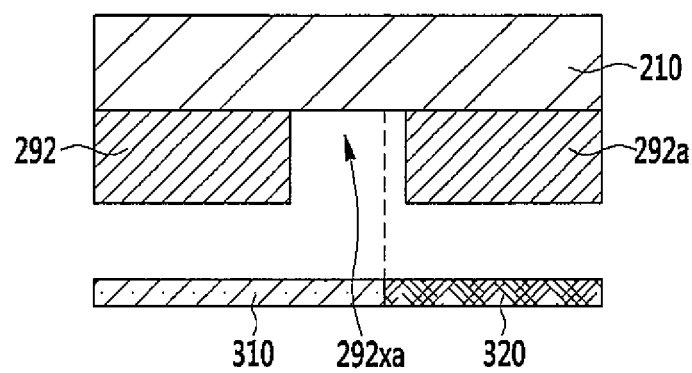
Figure 19:
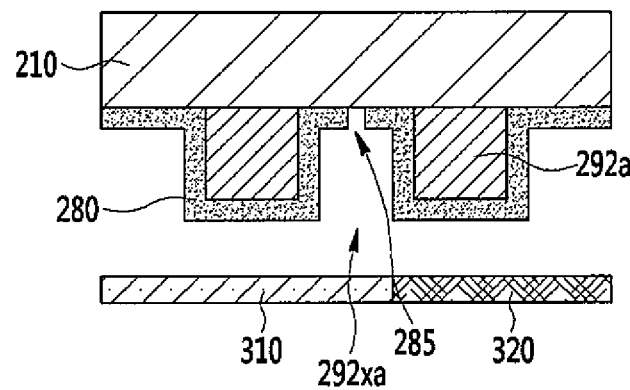

FIGS. 12, 13, and 14 are cross-sectional views of peripheral areas of display devices according to other exemplary embodiments of the present invention, FIGS. 15 and 16 sequentially illustrate a cross-sectional structure of an intermediate product in a manufacturing process of a method of manufacturing the display device according to an exemplary embodiment of the present invention, and FIGS. 17, 18, and 19 are cross-sectional views of peripheral areas of display devices according to other exemplary embodiments of the present invention.

First, referring to FIG. 12, a display device 1 according to another exemplary embodiment of the present invention is mostly the same as the display device according to the aforementioned exemplary embodiments of the present invention as illustrated in FIGS. 7 to 11, but a first transparent film 291p may be further positioned between a second reflecting layer 292 and an upper substrate 210.

The first transparent film 291p may substantially have the same plane shape as that of the second reflecting layer 292. That is, the first transparent film 291p might not exist in openings 292x and 292y of the second reflecting layer 292, and may be positioned only between the second reflecting layer 292 and the upper substrate 210.

The display device 1 according to this exemplary embodiment of the present invention may further include a second transparent film 293 positioned between the second reflecting layer 292 and the first reflecting layer 280, and between the upper substrate 210 and the first reflecting layer 280. The second transparent film 293 is not patterned, and may be substantially continuously formed on the upper substrate 210 including the second reflecting layer 292.

The first transparent film 291p and the second transparent film 293 may include at least one selected from a transparent conductive material, such as ITO and IZO, and a transparent inorganic material, such as a silicon oxide (SiOx), a silicon nitride (SiNx), and/or an aluminum oxide ($Al_2O_3$).

Next, referring to FIGS. 13 and 14, a display device 1 according to another exemplary embodiment of the present invention is mostly the same as the display device according to the aforementioned exemplary embodiment illustrated in FIG. 12, but a first reflecting layer 280 may include one or more openings 285 positioned in a peripheral area PA. Accordingly, the first reflecting layer 280 is discontinuous, thereby preventing impurities, such as moisture, from the outside from propagating along the first reflecting layer 280.

Referring to FIG. 13, in the display device according to this exemplary embodiment of the present invention, the openings 285 may be positioned between two adjacent portions of the second reflecting layer 292. That is, the openings 285 may be positioned in a part that does not overlap the second reflecting layer 292.

Referring to FIG. 14, in the display device according to another exemplary embodiment of the present invention, the openings 285 may be positioned at a part corresponding to the second reflecting layer 292. That is, the openings 285 may overlap the second reflecting layer 292.

The characteristics of the openings 285 are the same as the characteristics described in the exemplary embodiment illustrated in FIGS. 10 and 11, and a detailed description thereof may be omitted hereafter.

Next, a method of manufacturing the display device according to an exemplary embodiment of the present invention will be described with reference to FIGS. 15 and 16 together with FIGS. 12 to 14.

First, referring to FIG. 15, a first transparent pre-layer 291 is formed by stacking at least one selected from a transparent conductive material, such as an ITO and IZO, and a transparent inorganic material, such as a silicon oxide (SiOx), a silicon nitride (SiNx), and/or an aluminum oxide ($Al_2O_3$), on an upper substrate 210 formed of an insulating material, such as glass and/or plastic.

Next, a second reflecting pre-layer 290 is formed by stacking a reflective material, such as a metal including aluminum (Al), silver (Ag), chrome (Cr), molybdenum (Mo), iron (Fe), platinum (Pt), mercury (Hg), nickel (Ni), tungsten (W), and/or vanadium (V), on the first transparent pre-layer 291.

Next, referring to FIG. 16, a first transparent film 291p and a second reflecting layer 292 on the first transparent film 291p are formed by patterning the second reflecting pre-layer 290 and the first transparent pre-layer 291. A photolithography process or the like may be used as the patterning method. Particularly, the second reflecting pre-layer 290 and the first transparent pre-layer 291 positioned in the peripheral area PA are patterned to have openings 292x positioned so as to correspond to at least one selected from a getter 320, a sealant 310, and the peripheral area PA positioned at an outer side of the sealant 310.

Next, referring to FIG. 12, a second transparent film 293 is formed by stacking at least one selected from a transparent conductive material, such as an ITO and an IZO, and a transparent inorganic material, such as a silicon oxide (SiOx), a silicon nitride (SiNx), and/or an aluminum oxide ($Al_2O_3$), on an entire surface of the upper substrate 210 including the second reflecting layer 292.

Next, a first reflecting layer 280 is formed by stacking a reflective material, such as a metal including aluminum (Al), silver (Ag), chrome (Cr), molybdenum (Mo), iron (Fe), platinum (Pt), mercury (Hg), nickel (Ni), tungsten (W), and/or vanadium (V), on the second transparent film 293.

Further, as illustrated in FIGS. 13 and 14, one or more openings 285 may be formed by patterning the first reflecting layer 280. The openings 285 may be positioned between two adjacent portions of the second reflecting layer 292, or may be positioned at parts corresponding to the second reflecting layers 292. Particularly, the first reflecting layer 280 positioned in the peripheral area PA may be patterned to have the openings 285 positioned so as to correspond to at least one selected from the getter 320, the sealant 310, and the peripheral area PA positioned at the outer side of the sealant 310.

The upper substrate 210 formed as described above is bonded to a separately provided lower substrate 110 with the sealant 310 and/or the getter 320 interposed therebetween, so that the display device according to the exemplary embodiment of the present invention may be manufactured.

In the exemplary embodiments illustrated in FIGS. 12 to 14, at least one selected from the first transparent film 291p and the second transparent film 293 may be omitted.

Next, referring to FIG. 17, the display device according to another exemplary embodiment of the present invention is mostly the same as the aforementioned exemplary embodiments illustrated in FIGS. 7 to 14, but the first reflecting layer 280 may be omitted. A reflecting layer 292a illustrated in FIG. 17 may be substantially the same as the second reflecting layer 292 according to the aforementioned exemplary embodiments, and may further include additional characteristics as described below.

The patterned reflecting layer 292a may include a part formed so as to face a center part of the sealant 310 and/or a part formed so as to face a center part of the getter 320. The reflecting layer 292a facing the sealant 310 may be further extended to overlap most of the sealant 310, and the reflecting layer 292a facing the getter 320 may be further extended to overlap most of the getter 320.

Openings 292xa may be positioned at both sides of the reflecting layer 292a facing the sealant 310, respectively, and openings 292xa may be positioned at both sides of the reflecting layer 292a facing the getter 320, respectively.

The openings 292xa between the reflecting layer 292a facing the sealant 310 and the reflecting layer 292a facing the getter 320 may overlap a boundary surface between the sealant 310 and the getter 320, but is not limited thereto, and widths of the openings 292xa may be further decreased or increased compared to the illustration.

According to another exemplary embodiment of the present invention, the first reflecting layer 280 according to the aforementioned exemplary embodiments may be further formed on the reflecting layer 292a.

Next, referring to FIG. 18, a display device according to another exemplary embodiment of the present invention is mostly the same as the display device according to the exemplary embodiment illustrated in FIG. 17, but a reflecting layer 292a may be mostly continuously formed in areas facing a sealant 310 and a getter 320, but the display device may include an opening 292xa overlapping a boundary surface between the sealant 310 and the getter 320. As illustrated in FIG. 18, the reflecting layer 292a overlaps each of the sealant 310 and the getter 320 with a large area, so that it is possible to effectively prevent the sealant 310 and the getter 320 from being recognized/seen from the outside. In the present exemplary embodiment, widths of the openings 292xa may be further decreased or increased compared to the illustration.

According to another exemplary embodiment of the present invention, the first reflecting layer 280 according to the aforementioned exemplary embodiments may be further formed on the reflecting layer 292a.

Next, referring to FIG. 19, a display device according to another exemplary embodiment of the present invention is mostly the same as the display device according to the exemplary embodiment illustrated in FIG. 17, but the display device may further include a first reflecting layer 280 positioned on a reflecting layer 292a and on an upper substrate 210. The first reflecting layer 280 may include one or more openings 295 positioned in a peripheral area PA similar to the aforementioned exemplary embodiments. The openings 285 are the same as the aforementioned openings, so that a detailed description thereof may be omitted.

While embodiments of the invention have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their respective equivalents.

DESCRIPTION OF SOME OF THE REFERENCE SYMBOLS

1: Display device
110, 210: Substrate
280: First reflecting layer
285, 292x: Opening
291p: First transparent film
292: Second reflecting layer
293: Second transparent film

What is claimed is:
1. A display device, comprising:
a lower substrate;
an upper substrate facing the lower substrate;
a thin film transistor on the lower substrate; and
a first reflecting layer on a first surface of the upper substrate, the first surface facing the lower substrate,
wherein the lower substrate and the upper substrate comprise a display area for displaying an image, and a peripheral area outside the display area, and
wherein the first reflecting layer is at the peripheral area, at the display area, and at an area adjacent an edge of the upper substrate.
2. The display device of claim 1, wherein the first reflecting layer comprises one or more first openings at the peripheral area.
3. The display device of claim 2, wherein a portion of the one or more first openings extends along an edge of the lower substrate or along the edge of the upper substrate.

4. The display device of claim 2, further comprising a sealant at the peripheral area between the lower substrate and the upper substrate, wherein the one or more first openings overlap at least one selected from the sealant and the peripheral area at an outer side of the sealant.

5. The display device of claim 1, further comprising a second reflecting layer between the first reflecting layer and the upper substrate.

6. The display device of claim 5, wherein the second reflecting layer comprises one or more second openings at the peripheral area.

7. The display device of claim 6, wherein a portion of the one or more second openings extends along an edge of the lower substrate or along the edge of the upper substrate.

8. The display device of claim 7, further comprising a sealant at the peripheral area between the lower substrate and the upper substrate, wherein the one or more second openings overlap at least one selected from the sealant and the peripheral area at an outer side of the sealant.

9. The display device of claim 8, wherein the first reflecting layer comprises one or more first openings at the peripheral area.

10. The display device of claim 9, wherein the one or more first openings overlap at least one selected from the sealant and the peripheral area at an outer side of the sealant.

11. The display device of claim 10, wherein the one or more first openings overlap the one or more second openings.

12. The display device of claim 10, wherein the one or more first openings overlap the second reflecting layer.

13. The display device of claim 6, wherein the second reflecting layer comprises one or more third openings in the display area.

14. The display device of claim 13, wherein the one or more third openings overlaps a unit display area, the unit display area being at the display area and at a unit area for displaying an image.

15. The display device of claim 6, further comprising at least one selected from a first transparent film between the second reflecting layer and the upper substrate, and a second transparent film at the second reflecting layer.

16. The display device of claim 6, further comprising a sealant at the peripheral area between the lower substrate and the upper substrate, wherein the second reflecting layer comprises a first part facing the sealant.

17. The display device of claim 16, wherein the second opening is at both sides or is at one side of the first part of the second reflecting layer.

18. The display device of claim 17, further comprising a getter between the sealant and the display area, and between the upper substrate and the lower substrate.

19. The display device of claim 18, wherein the second reflecting layer comprises a second part facing the getter.

20. The display device of claim 19, wherein the one or more second openings are at both sides or are at one side of the second part of the second reflecting layer.

* * * * *